United States Patent
Seo et al.

(10) Patent No.: US 8,461,490 B2
(45) Date of Patent: Jun. 11, 2013

(54) SUBSTRATE HEATING UNIT AND SUBSTRATE TREATING APPARATUS INCLUDING THE SAME

(75) Inventors: Jong Seok Seo, Chungcheongnam-do (KR); Jaeseung Go, Gyeonggi-do (KR)

(73) Assignee: Semes Co., Ltd., Chungcheongnam-Do (KR)

(*) Notice: Subject to any disclaimer, the term of this patent is extended or adjusted under 35 U.S.C. 154(b) by 376 days.

(21) Appl. No.: 12/797,673

(22) Filed: Jun. 10, 2010

(65) Prior Publication Data

US 2010/0314380 A1    Dec. 16, 2010

(30) Foreign Application Priority Data

Jun. 11, 2009    (KR) .................. 10-2009-0051971

(51) Int. Cl.
*H05B 3/68* (2006.01)

(52) U.S. Cl.
USPC ........................ 219/444.1; 118/725

(58) Field of Classification Search
USPC .. 219/443.1, 444.1; 118/725; 279/3; 294/188
See application file for complete search history.

(56) References Cited

U.S. PATENT DOCUMENTS

| | | | |
|---|---|---|---|
| 5,564,682 A * | 10/1996 | Tsuji | 269/21 |
| 6,730,175 B2 * | 5/2004 | Yudovsky et al. | 118/728 |

FOREIGN PATENT DOCUMENTS

| | | |
|---|---|---|
| JP | 60-200963 | 10/1985 |
| JP | 61-215289 | 9/1986 |
| JP | 08-153660 | 6/1996 |
| JP | 09-251948 | 9/1997 |
| JP | 2004-152914 | 5/2004 |
| JP | 2004-158547 | 6/2004 |
| JP | 2004-200619 | 7/2004 |
| KR | 102030072261 A | 9/2003 |
| KR | 1020060135185 A | 12/2006 |

* cited by examiner

*Primary Examiner* — Charles Garber
*Assistant Examiner* — Reema Patel
(74) *Attorney, Agent, or Firm* — Carter, DeLuca, Farrell & Schmidt LLP

(57) ABSTRACT

Provided are a substrate heating unit heating a substrate, and a substrate treating apparatus including the same. The substrate heating unit heats the substrate by transferring heat generated from a resistance heat generating member to a supporting plate. The supporting plate includes an upper plate having a central region which is thicker than an edge region thereof, and a lower plate made of a material having a thermal conductivity lower than the material of the upper plate. By a difference in the shape and material of the upper plate and lower plate, heat arrives at the substrate more rapidly in the edge region than in the central region, so that an entire surface of the substrate is heated uniformly.

22 Claims, 9 Drawing Sheets

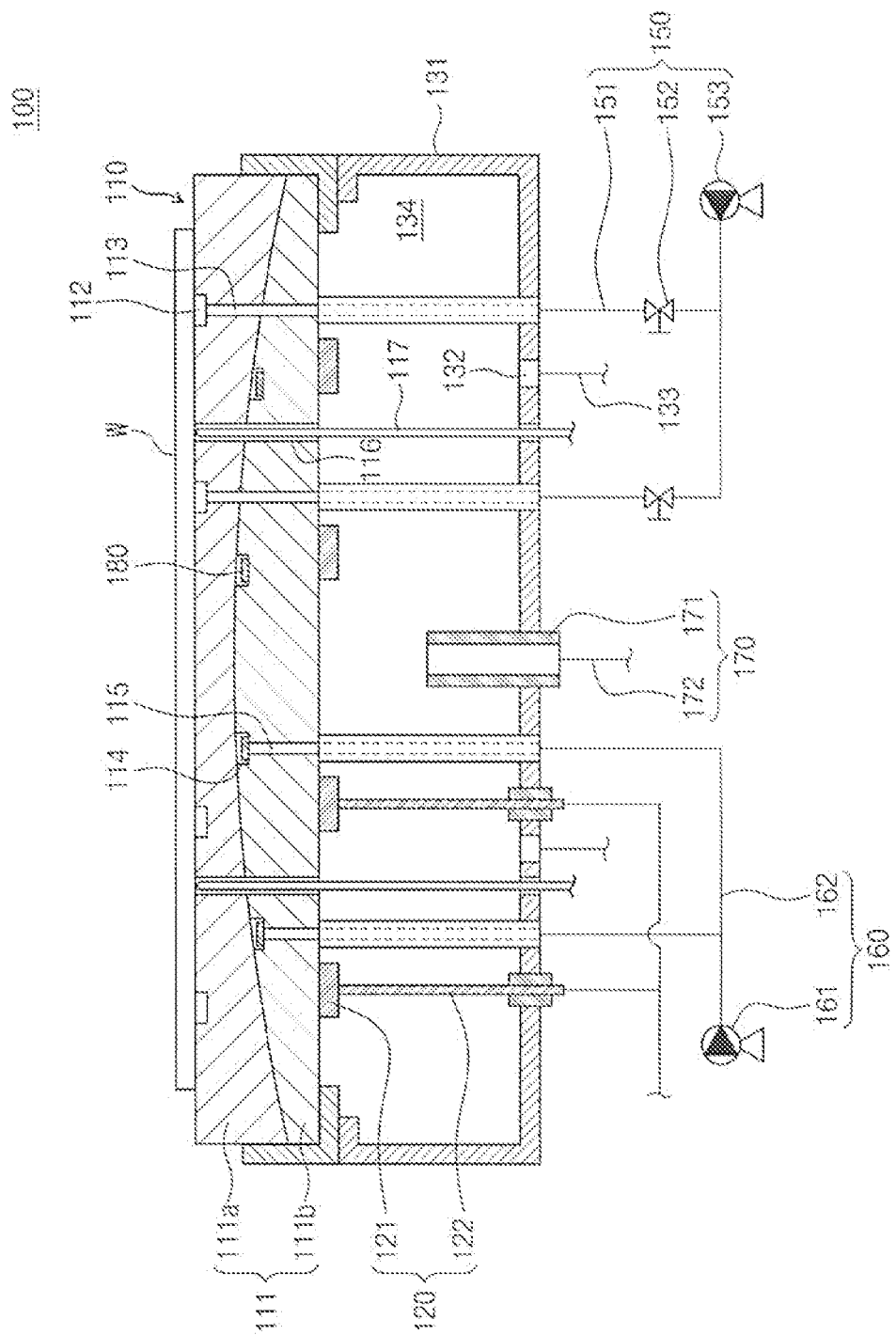

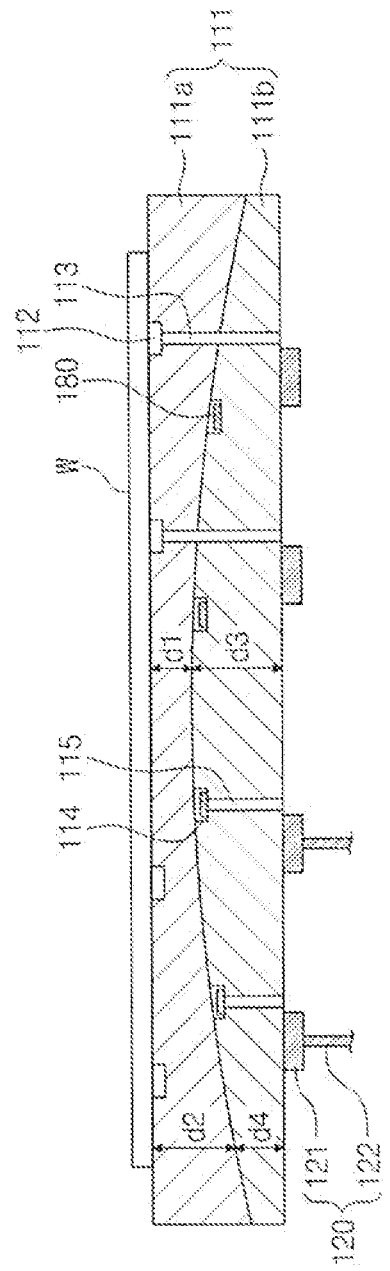

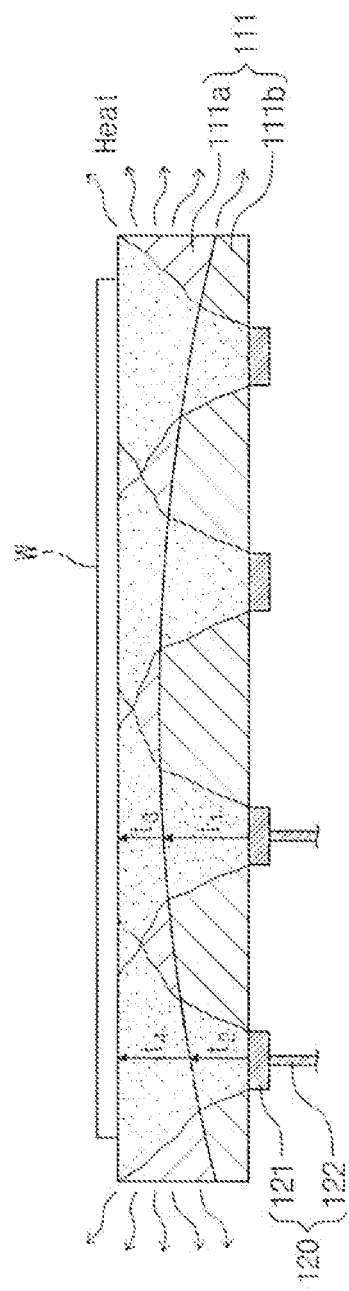

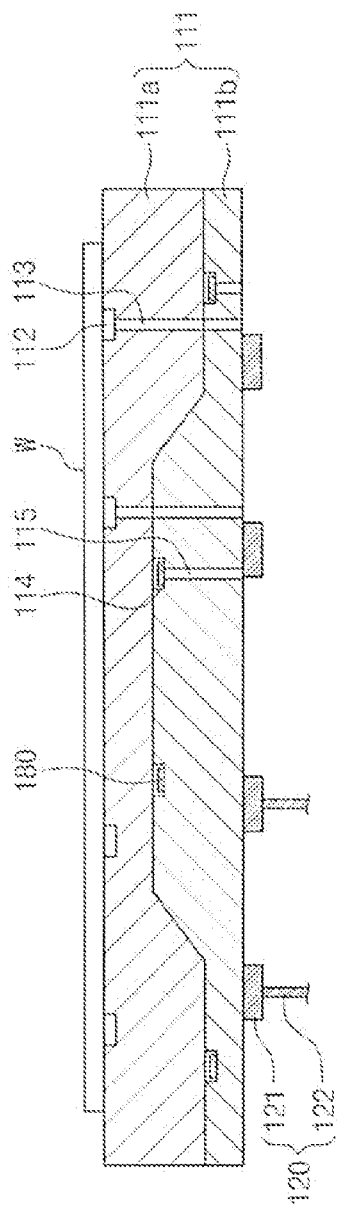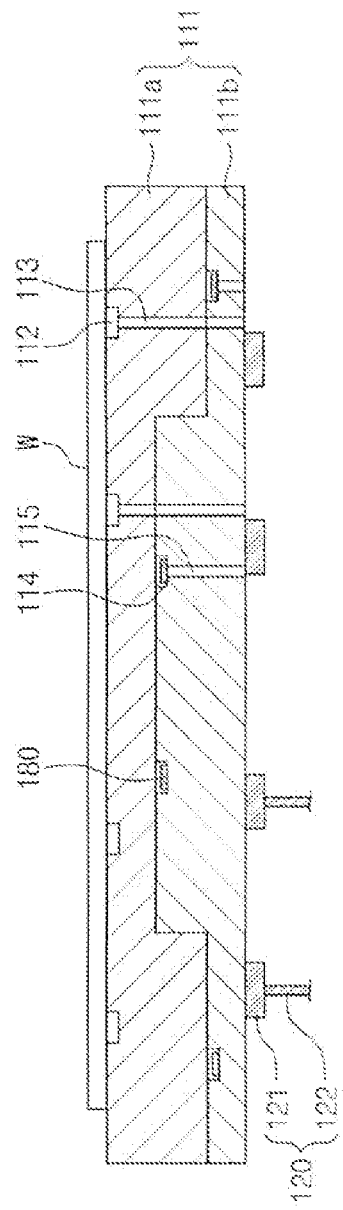

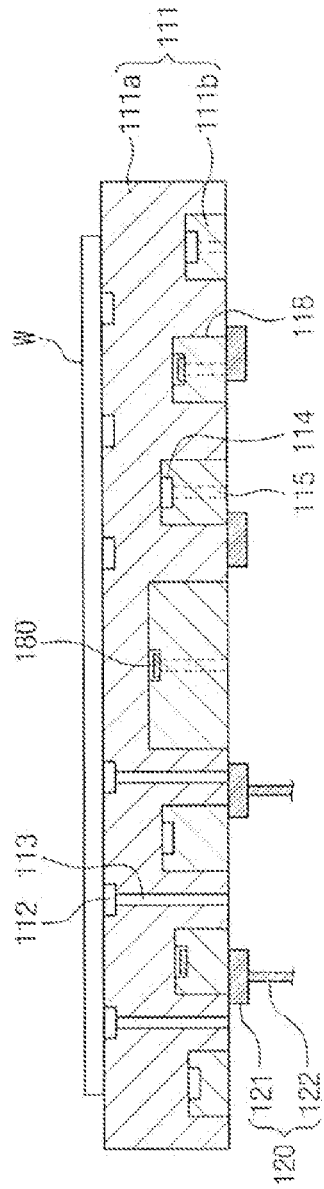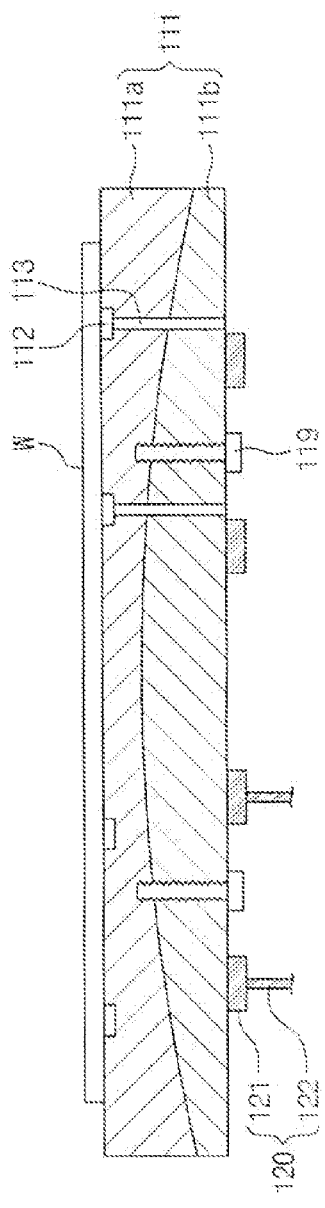

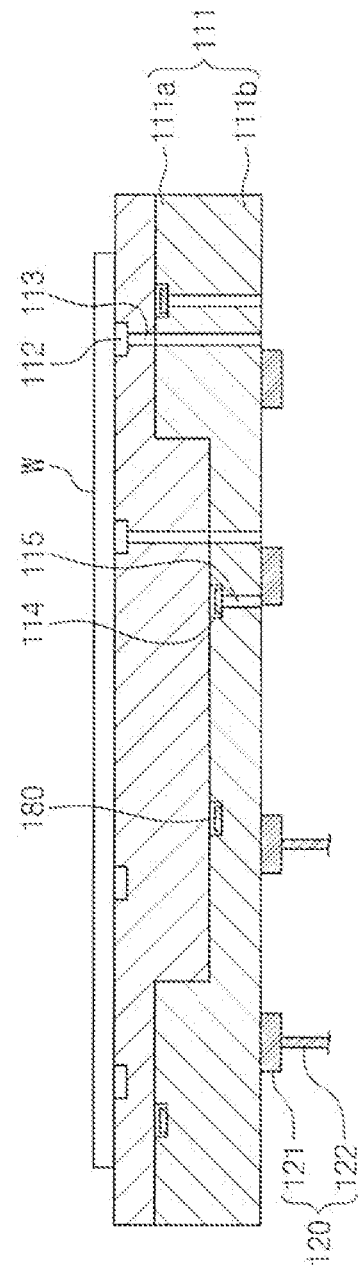

SUBSTRATE HEATING UNIT AND SUBSTRATE TREATING APPARATUS INCLUDING THE SAME

CROSS-REFERENCE TO RELATED APPLICATIONS

This U.S. non-provisional patent application claims priority under 35 U.S.C. §119 of Korean Patent Application Nos. 10-2009-0051971, filed on Jun. 11, 2009, the entire contents of which are hereby incorporated by reference.

BACKGROUND

The present disclosure herein relates to a substrate treating apparatus configured to treat a substrate, and more particularly, to a substrate heating unit configured to heat a substrate, and a substrate treating apparatus.

In a semiconductor manufacturing apparatus performing processes, such as forming of a semiconductor layer, etching, and treating of a resist layer, a heater for heating a substrate is used.

Since fineness of semiconductor device pattern and enhancement in the preciseness of heat treating temperature are required, a ceramic heater having an excellent temperature control characteristic is widely used for the heater. Such a heater is provided in a structure including a plate supporting a substrate, and a resistance heat generating member made of a composite material of metal particles and glass and attached on a rear surface of the plate.

Since the related art heater uses the plate made of a single material, the following problems may be caused. Since the plate is a metal material, if the plate is thin, bending, distortion, etc. of the plate may be caused under a high temperature state (about 200° C. or more). This thermal deformation may act as a factor destroying the substrate on the plate. On the contrary to this, if the plate is thick, the weight and volume of the heater may increase. Also, while heat generated from the resistance heat generating member is transferred to the substrate through the plate, much heat loss may be generated in an edge of the plate to a circumferential surface. This heat loss causes a difference in the heat flux supplied to the edge and a center of the substrate and thus becomes a factor non-uniformly maintaining the temperature of the substrate.

SUMMARY

The present disclosure provides a substrate heating unit and a substrate treating apparatus that can treat a substrate efficiently.

The present disclosure also provides a substrate heating unit and a substrate treating apparatus that can heat an entire surface of a substrate uniformly.

The present disclosure also provides a substrate heating unit and a substrate treating apparatus that can prevent a damage of a substrate due to thermal deformation.

The present disclosure also provides a substrate heating unit and a substrate treating apparatus each having decreased weight and volume.

Embodiments of the inventive concept provide substrate heating units, include: an upper plate on which a substrate is placed, the upper plate having different thicknesses in a radial direction; a lower plate positioned below the upper plate; and a heat generating member installed in the lower plate to generate heat. A lower surface of the upper plate may have a curved shape, and an upper surface of the lower plate may have a shape corresponding to the lower surface of the upper plate. An edge region of the upper plate may be thicker than a central region of the upper plate. The lower surface of the upper plate may have a concave shape.

In some embodiments, a lower surface of the upper plate may be stepped such that a central region of the lower surface of the upper plate is positioned at a higher level than an edge region of the lower surface of the upper plate.

In other embodiment, the lower surface of the upper plate may have a downward convex shape.

In still other embodiments, a lower surface of the upper plate may be stepped such that a central region of the lower surface of the upper plate is positioned at a lower level than an edge region of the lower surface of the upper plate.

In even embodiments, a material of the upper plate or a material of the lower plate may have a thermal conductivity higher than the other. In an embodiment, a material of the upper plate may have a thermal conductivity higher than the material of the lower plate. A material of the upper plate may be a nitride ceramic or carbide ceramic, and the material of the lower plate may be an insulator ceramic.

In yet embodiments, the upper surface of the upper plate may be formed with a plurality of first vacuum holes in a radial direction thereof, the pressure of the first vacuum holes is controlled individually or as a group such that the pressure inside the first vacuum holes is changed according to the region of the substrate, wherein the substrate heating unit may further include: a first vacuum pump; and a first vacuum line connecting the first vacuum pump to the first vacuum holes.

In further embodiments, the lower surface of the upper plate or the upper surface of the lower plate may be formed with a groove, and the lower plate is formed with a second vacuum hole connected to the groove, wherein the substrate heating unit may include: a second vacuum pump; and a second vacuum line connecting the second vacuum pump to the second vacuum hole.

In still further embodiments, the groove may have a ring shape and is provided in plurality, and the ring-shaped grooves may have a coaxial axis and different diameters.

In even further embodiments, the heat generating member may include a resistance heat generating member coupled to a lower surface of the lower plate to generate heat by an applied electric power.

In yet further embodiments, the lower surface of the upper plate may be formed with an insert groove, and the lower plate is inserted into the insert groove. The lower plate may be provided in plurality, and the plurality of lower plates may be separatable independently from the insert groove. The plurality of lower plates may be divided into plural groups each having at least one the lower plate, and the plural groups may include a group including the lower plates which are combined and are disposed in a single ring shape.

In other embodiments, the substrate heating unit may further include a temperature measuring member positioned at the groove to measure the temperature of the upper plate.

In still other embodiments of the inventive concept, substrate treating apparatuses include: a process chamber having an inner space; an upper plate positioned in the inner space, supporting a substrate, and having a thickness different in a radial direction thereof; a lower plate positioned below the upper plate and having an upper surface corresponding to a lower surface of the upper plate; and a heat generating member installed in the lower plate to generate heat, wherein a material of the upper plate has a thermal conductivity higher than the material of the lower plate.

In even other embodiments, the upper plate may have a thickness increasing as it goes far from a center thereof. The upper plate may have a central region which is thicker than an edge region thereof. The lower surface of the upper plate may have a concave shape.

In yet other embodiments, the upper surface of the upper plate may be formed with a plurality of first vacuum holes in a radial direction thereof, the pressure of the first vacuum holes is controlled individually or as a group such that the pressure inside the first vacuum holes is changed according to the region of the substrate, wherein the substrate heating unit includes: a first vacuum pump; and a first vacuum line connecting the first vacuum pump to the first vacuum holes.

In further embodiments, the lower surface of the upper plate or the upper surface of the lower plate may be formed with a groove, and the lower plate may be formed with a second vacuum hole connected to the groove, wherein the substrate treating apparatus includes: a second vacuum pump; and a second vacuum line connecting the second vacuum pump to the second vacuum hole.

In still further embodiments, the heat generating member may include a resistance heat generating member coupled to a lower surface of the lower plate to generate heat by an applied electric power.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 2 is a schematic sectional view of the substrate heating unit according to an embodiment of the inventive concept;

FIG. 3 is a schematic sectional view of a substrate supporting part according to an embodiment of the inventive concept.

FIG. 5 is a schematic sectional view illustrating a process that heat is transferred to the substrate W according to an embodiment;

FIGS. 6A through 6C are schematic sectional views illustrating supporting plates according to different embodiments of the inventive concept;

FIGS. 7A and 7B are schematic sectional views illustrating coupling structures of upper plate and lower plate according to another embodiment of the inventive concept; and FIGS. 8A and 8B are schematic sectional views illustrating shapes of upper plate and lower plate according to another embodiment of the inventive concept.

DETAILED DESCRIPTION OF THE EMBODIMENTS

Figure 1:
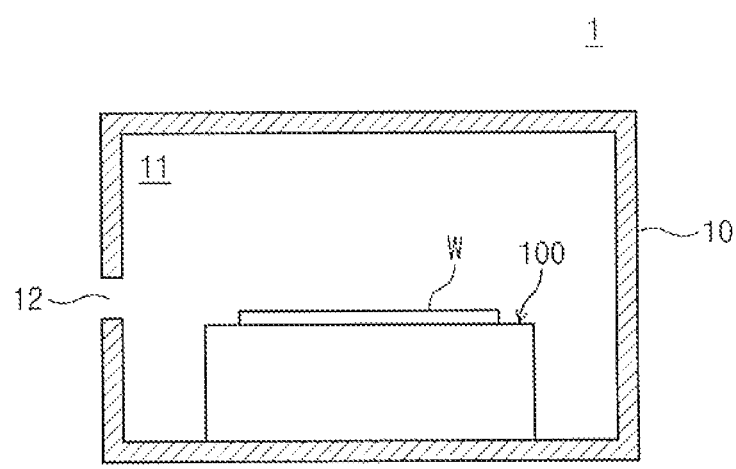
FIG. 1 is a schematic view illustrating a substrate treating apparatus according to an embodiment of the inventive concept.

Exemplary embodiments of the inventive concept will be described below in more detail with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

FIG. 1 is a schematic view illustrating a substrate treating apparatus 1 according to an embodiment.

Referring to FIG. 1, the substrate treating apparatus 1 includes a process chamber 10 in which a process for treating a substrate W is performed, and a substrate heating unit 100 heating the substrate W provided for performing the process. The process chamber 10 has an inner space 11, and an opening 12 formed at one sidewall thereof, through which the substrate W is loaded or unloaded. In the process chamber 10, a baking process for elevating the temperature of the substrate W to a predetermined temperature to treat the substrate W is performed. The substrate heating unit 100 is positioned in the inner space 11 of the process chamber to heat the substrate W to a predetermined temperature.

FIG. 2 is a schematic sectional view of the substrate heating unit 100 according to an embodiment of the inventive concept, and FIG. 3 is a schematic sectional view of a substrate supporting part 110 according to an embodiment of the inventive concept.

Referring to FIGS. 2 and 3, the substrate heating unit 100 includes the substrate supporting part 110, a heat generating member 120, a cooling member 170, and a temperature measuring member 180. The substrate supporting part 110 supports a substrate W and transfers heat generated from the heat generating member 120 to the substrate W. The heat generating member 120 is supplied with power from an outside to generate heat, and the cooling member 170 rapidly cools the heated substrate supporting part 110 and substrate W to a predetermined temperature. The temperature measuring part 180 measures the temperature of the substrate supporting part 110 transferring heat to the substrate W. Hereinafter, the foregoing elements will be described in more detail.

The substrate supporting part 110 includes a supporting plate 111 supporting the substrate W, and a case 131 supporting the supporting plate 111.

The supporting plate 111 is provided in a circular plate shape, and includes an upper plate 111a on which the substrate is placed, and a lower plate 111b positioned below the upper plate 111a. The upper plate 111a and the lower plate 111b may be separated. The upper plate 111a is coupled to the lower plate 111b by a coupling member 160 to be described later such that a lower surface of the upper plate 111a facially contacts an upper surface of the lower plate 111b. The lower surface of the upper plate 111a and the upper surface of the lower plate 111b have shapes corresponding to each other.

The upper plate 111a is provided such that a thickness of a central region thereof is different from a thickness of an edge region thereof in a radial direction. According to an embodiment, the edge region of the upper plate 111a is thicker than the central region of the upper plate 111a. Concretely, a distance d1 between an upper surface of the upper plate 111a and the lower surface of the upper plate 111a in the central region of the upper plate 111a is shorter than a distance d2 between the upper surface and the lower surface of the upper plate 111a in the edge region, and a distance d3 between the upper surface and a lower surface of the lower plate 111b in the central region of the lower plate 111b is greater than a distance d4 between the upper surface and the lower surface of the lower plate 111b in the edge region of the lower plate 111b.

According to an example, the lower surface of the upper plate 111a is provided in a curved shape. The lower surface of the upper plate 111a is provided in a concave curved shape, and the upper surface of the lower plate 111b is provided in a convex curved shape. The upper surface of the lower plate 111b is positioned in a concave lower space of the upper plate 111a. The upper plate 111a has a thickness increasing as it goes far from the center of the upper plate 111a in the radial direction, and the lower plate 111b has a thickness decreasing as it goes far from the center of the lower plate 111b in the radial direction.

The material of the upper plate 111a is different from the material of the lower plate 111b. According to an embodiment, the material of the upper plate 111a has a thermal conductivity higher than the material of the lower plate 111b. Also, the material of the upper plate 111a has a thermal transformation less than the material of the lower plate 111b. For example, the material of the upper plate 111a is a nitride ceramic or carbide ceramic, and the material of the lower plate 111b is an insulator ceramic. Since the material of the upper plate 111a has the thermal conductivity higher than the material of the lower plate 111b, the upper plate 111a has a heat transfer rate and heat transfer flux higher than the lower plate 111b.

Also, since the upper plate 111a has a thermal transformation less than the lower plate 111b, although the supporting plate 111 is heated to a high temperature (200° C. or more), substrate damage due to bending phenomenon can be prevented. In the case where the supporting plate 111 is a single plate, when the supporting plate 111 is heated to a high temperature (200° C. or more), the supporting plate 111 may be bent. Since the bending of the supporting plate 111 damages the substrate W placed on the supporting plate 111, it becomes impossible to perform a long-terms process in the high temperature state. However, in the inventive concept, since the supporting plate 111 is divided into the upper plate 111a and the lower plate 111b and the upper plate 111a mounting the substrate W thereon is made of the material having a small thermal transformation, although the supporting plate 111 maintains the high temperature state, the supporting plate 111 can support the substrate W stably.

A plurality of grooves 112 for adsorbing the substrate W are formed in the upper surface of the substrate W, and first vacuum holes 113 respectively connected to the plurality of grooves 112 are formed in the upper plate 111a.

Figure 4A:
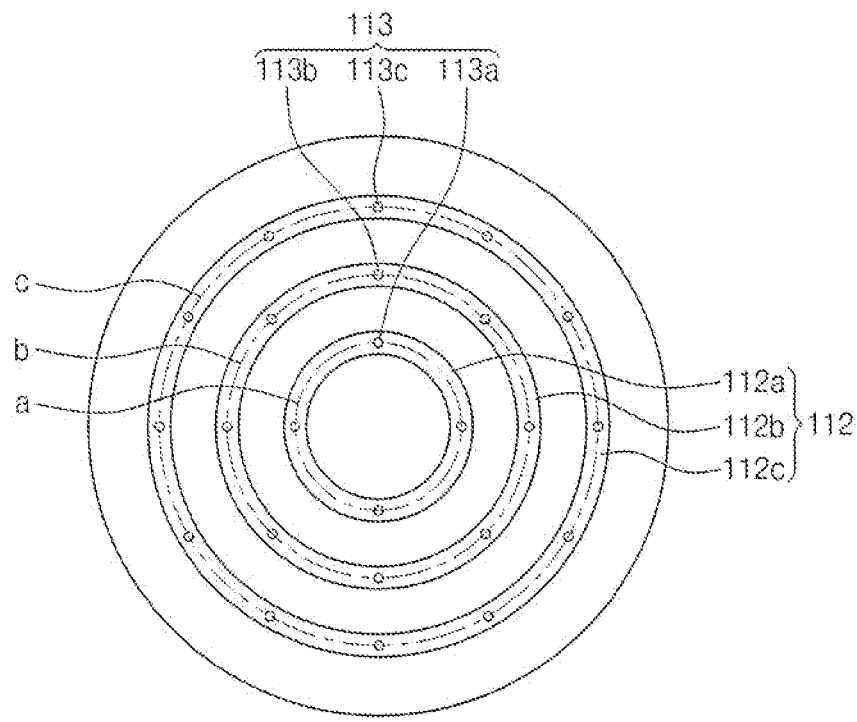
FIG. 4A is a plan view illustrating the grooves and the first vacuum holes formed in the upper surface of the upper plate.
Figure 4B:
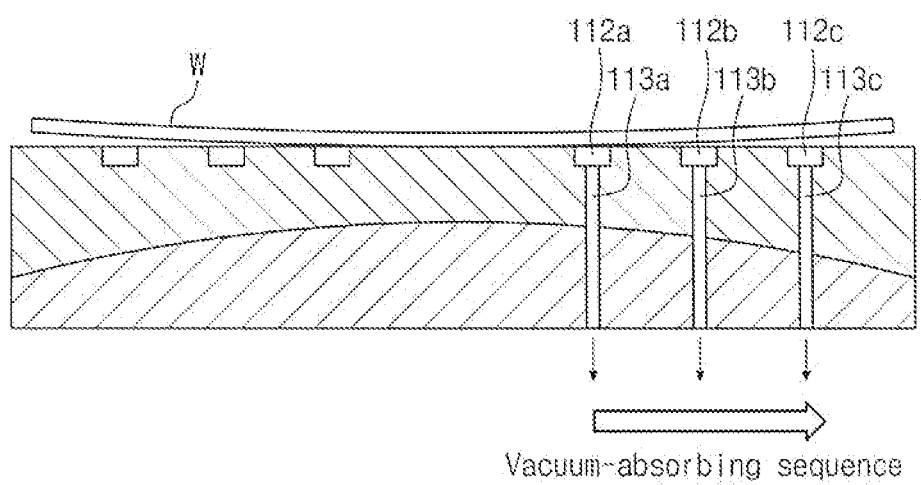
FIG. 4B is a schematic view illustrating a process that the first vacuum holes adsorb the substrate under vacuum.

FIG. 4A is a plan view illustrating the grooves 112 and the first vacuum holes 113 formed in the upper surface of the upper plate 111a, and FIG. 4B is a schematic view illustrating a process that the first vacuum holes 113 adsorb the substrate under vacuum.

Referring to FIGS. 2, 4A and 4B, the plurality of grooves 112 are arranged in a ring shape along a circumferential direction of the upper plate 111a. The plurality of grooves 112 are arranged coaxially and have different diameters. The diameters of the plurality of grooves 112 increase as it goes far from the center of the upper plate 111a. The plurality of first vacuum holes 113 are arranged spaced apart from one another along each of the plurality of grooves 112. The plurality of first vacuum holes 113 connect the plurality of grooves 112 to a first vacuum line 151 to be described later, and exhaust air staying at the plurality of grooves 112 to an outside. Due to the exhaust of air, the pressure inside the plurality of grooves 112 is decreased, so that the substrate is adsorbed on the upper surface of the upper plate 111a by vacuum. The pressure inside the first vacuum holes 113 may be controllable individually or as a group. According to an embodiment, the first vacuum holes 113 are connected to the first vacuum lines 151, respectively, and a vacuum control valve 152 capable of controlling intake amount is installed in each of the vacuum lines 151. By controlling the vacuum control valve 152, it is possible to control the pressures of the first vacuum holes 113. According to another embodiment, the first vacuum holes 113 are divided into a plurality of groups. Concretely, the first vacuum holes 113 formed along any one of the plurality of ring-shaped grooves 112 are classified as the same group. Three ring-shaped grooves 112a, 112b, 112c are formed spaced apart from one another in the upper surface of the upper plate 111a (see FIG. 6A). The first vacuum holes 113a connected to the first groove 112a constitute a first group 'a', the first vacuum holes 113b connected to the second groove 112b constitute a second group and the first vacuum holes 113c connected to the third groove 112c constitute a third group 'c'. The groups 'a, b, c' of the first vacuum holes are respectively connected to the first vacuum lines 151 that are different from one another, and the pressure of each of the groups 'a, b, c' of the first vacuum holes is controlled uniformly by controlling the vacuum control valve 152 installed on each of the first vacuum lines 151. Since the pressure of the first vacuum holes 113 is controllable individually or as a group, it is possible to change the adsorptive forces of the first vacuum holes 113 according to the region of the substrate W. For example, while a process treatment for the substrate W is performed, in the case where the substrate W is bent due to a thermal transformation (see FIG. 6B), the pressures of the first vacuum holes 113 can be controlled according to the bent region and bent degree of the substrate W, the pressures of the first vacuum holes 113 can be controlled. In the case where a central region of the substrate W is bent, the pressures inside the first vacuum holes 113 may be decreased in the sequence of from the first vacuum holes 113a formed at the central region of the supporting plate 111 to the first vacuum holes 113c formed at the edge region of the supporting plate 111 to thus adsorb the substrate W safely. Also, by allowing the adsorptive force of the first vacuum holes 113c formed at the edge region of the supporting plate 111 to be higher than the adsorptive force of the first vacuum holes 113a formed at the central region of the supporting plate 111, it is possible to support the substrate W.

A plurality of grooves 114 for vacuum-adsorbing the lower surface of the upper plate 111a are formed in the upper surface of the lower plate 111b, and second vacuum holes 114 respectively connected to the plurality of grooves 114 are formed in the lower plate 111b. The plurality of grooves 114 are arranged in the form of plural rings along a circumferential direction of the lower plate 111b. The rings defined by the plurality of grooves 114 are arranged coaxially and have different diameters. The diameters of the rings increase as it goes far from the center of the lower plate 111b. A plurality of second vacuum holes 115 are arranged spaced apart from one another along each of the plurality of grooves 114. The plurality of second vacuum holes 114 connect the plurality of grooves 114 to a second vacuum line 162 to be described later, and exhaust air staying at the plurality of grooves 114 to an outside. Due to the exhaust of air, the pressure inside the plurality of grooves 114 is decreased, so that the lower surface of the upper plate 111a is adsorbed on the upper surface of the lower plate 111b by vacuum.

The supporting plate 111 includes a plurality holes 116 connecting an upper side and a lower side thereof. The plurality of holes 116 are provided as a path through which a lift pin ascends or descends. The lift pin 117 ascends or descends along the plurality of holes 116 to load/unload the substrate W on the upper surface of the upper plate 111a. When the substrate W is transferred to the upper surface of the upper plate 111a by a transfer robot (not shown), the lift pin 117 is ascended by a driving part (not shown) to hold the substrate W. Thereafter, the lift pin 117 descends to load the substrate W on the upper surface of the upper plate 111a. After the process treating for the substrate W is completed, the lift pin 117 ascends to unload the substrate W from the upper surface of the upper plate 111a. The unloaded substrate W is hold by the lift pin 117 and is then transferred to the transfer robot.

The coupling member 160 couples the upper plate 111a and the lower plate 111b such that the lower surface of the upper plate 111a closely contacts the upper surface of the lower plate 111b. The coupling member 160 includes a second vacuum pump 161 and the second vacuum line 162. The second vacuum line 162 connects a second vacuum hole 115 and the second vacuum pump 161. The second vacuum pump 161 exhausts air staying at the grooves 114 formed at the upper surface of the lower plate 111b to an outside through the second vacuum hole 115 and the second vacuum line 162 to thus decrease the pressure inside the grooves. By decreasing the pressure inside the grooves, the lower surface of the upper plate 111a and the lower surface of the lower plate 111b are adsorbed by vacuum.

The case 131 is positioned below the supporting plate 111 to support the supporting plate 111. The case 131 is formed in a bowl shape having an inner space 134 of which an upper surface is opened. Upper ends of the case 131 are bent toward the inner space 134. The supporting plate 111 is coupled to the upper ends of the case 131 and is supported. A plurality of gas exhaust holes 132 are formed at a lower sidewall of the case 131. The plurality of gas exhaust holes 132 are provided as a path for exhausting cooling gas supplied for cooling the supporting plate 111 to an outside.

The heat generating member 120 is supplied with power from an outside to generate heat to be transferred to the substrate W. The heat generating member 120 includes a resistance heat generating member 121, a conductive wire 122, and a power (not shown). The resistance heat generating member 121 is coupled to the lower surface of the lower plate 111b and resists current flowing by the power applied from the outside to generate heat. The resistance heat generating member 121 is formed by printing a metal paste or a conductive paste using a conductive ceramic on the lower surface of the lower plate 111b. The above pastes include metal particles or conductive ceramic particles. The resistance heat generating member 121 is electrically connected to the conductive wire 122. The conductive wire 122 electrically connects the resistance heat generating member 121 to the power such that current is supplied from the power to the resistance heat generating member 121.

The cooling member 170 cools the heated substrate supporting part 110 and substrate W to a predetermined temperature rapidly. The cooling member 170 includes a gas injection nozzle 171 and a gas supply line 172. The gas injection nozzle 171 is inserted into the case 131 such that an injection hole thereof injecting cooling gas is positioned in the inner space 134 of the case 131. The gas injection nozzle 171 is supplied with cooling gas from a gas storage part (not shown) through the gas supply line 172 to inject the cooling gas to the inner space 134 of the case 131. The cooling gas supplied for cooling the substrate supporting part 110 is exhausted to the outside via the gas exhaust line 133 through the gas exhaust hole 132. The heated substrate W is cooled to a preset temperature and is then provided to a next process. In the case of naturally cooling the substrate W, much time is taken in cooling the substrate W to the preset temperature, so that the process time may be increased. To solve this limitation, the cooling gas is injected toward the supporting plate 111 to cool the substrate W rapidly forcibly.

The temperature measuring member 180 measures the temperature of the supporting plate 111 transferring heat to the substrate W. From data measured by the temperature measuring member 180, the electric power supplied to the resistance heat generating member 121 is controlled to thus control the temperature of the substrate W. The temperature measuring member 180 is positioned in the groove 114 formed at the upper surface of the lower plate 111b, and includes a temperature sensor measuring the temperature of the upper plate 111a. It is efficient to position the temperature sensor below the upper plate 111a, which is apart by 1 mm to 5 mm from the upper plate 111a.

FIG. 5 is a schematic sectional view illustrating a process that heat is transferred to the substrate W according to an embodiment.

Referring to FIG. 5, heat generated from the resistance heat generating member 121 is transferred to the substrate W through the supporting plate 111. While the heat is transferred to the substrate W, some of the heat supplied to the edge region of the supporting plate 111 is lost through a circumferential surface of the supporting plate 111 contacting outer air. Therefore, although the same amount of heat is supplied to the respective regions of the supporting plate 111, since the heat supplied to the edge region of the supporting plate 111 is lost while being transferred to the substrate W, the amount of heat less than the amount of heat arriving at the central region arrives at the substrate W. Therefore, the substrate W is heated non-uniformly. However, according to the inventive concept, since the upper plate 111a is made of a material having a thermal conductivity higher than the material of the lower plate 111b and the edge region of the upper plate 111a is thicker than the central region of the upper plate 111a, heat can be supplied uniformly to an entire surface of the substrate W. In more detail, in the case where a constant amount of heat is supplied to the respective regions of the lower plate 111b, the supplied heat is transferred from the lower surface of the lower plate 111b to the upper surface of the lower plate 111b. At this time, since the central region of the lower plate 111b is thicker than the edge region of the lower plate 111b, a time t1 taken in arriving at the upper surface of the central region of the lower plate 111b is greater than the time t2 taken in arriving at the upper surface of the edge region of the lower plate 111b (i.e., t1>t2). Thereafter, the heat arriving at the upper surface of the lower plate 111b is transferred to the upper plate 111a. Since the upper plate 111a is made of a material having a thermal conductivity higher than the material of the lower plate 111b, refraction of thermal diffusion is generated at the lower surface of the upper plate 111a. Due to this, a heat transfer region of the upper plate 111a is wider than the heat transfer region of the lower plate 111b. Since the edge region of the upper plate 111a is thicker than the central region of the upper plate 111a, a time t4 taken when heat is transferred to the substrate W in the edge region is greater than the time t3 taken when heat is transferred to the substrate W in the central region (i.e., t4>t3). However, since the upper plate 111a is made of a material having a thermal conductivity higher than the material of the lower plate 111b, the time t4 take when heat is transferred in the edge region of the upper plate 111a is less than the time t1 taken when heat is transferred in the central region of the lower plate 111b (i.e., t1>t4). That is, a total time taken when heat is transferred to the substrate W through the supporting plate 111 is less in the edge region than in the central region (i.e., t1+t3>t2+t4). Therefore, since more heat loss is generated in the edge region than in the central region but heat in the edge region is supplied within a time less than in the central region, the amount of heat supplied to the substrate W during the same time is maintained equally. Thus, since the amount of heat supplied to the substrate W is maintained uniformly according to the region of the substrate W, the entire surface of the substrate W is heated uniformly.

While the foregoing embodiment describes that the substrate heating unit 100 is used in the baking process, the inventive concept is not limited thereto. For example, the substrate heating unit 100 may be used in processes heating the substrate to a predetermined temperature, such as an ashing process, an etching process, and a deposition process.

Also, while the foregoing embodiment describes that the lower surface of the upper plate 111a has the concave curved shape, the inventive concept is not limited thereto. FIGS. 6A through 6C are schematic sectional views illustrating supporting plates 111 according to different embodiments of the inventive concept.

Referring to FIG. 6A, the lower surface of the upper plate 111a has a central region and an edge region which are flat, and a region between the central region and the edge region is an inclination surface. The central region is positioned at a higher level than the edge region, and the inclination surface is formed to decline as it goes far from the center of the upper plate 111a. The upper surface of the lower plate 111b has a shape corresponding to the lower surface of the upper plate 111a. As a whole, the edge region of the upper plate 111a is thicker than the central region of the upper plate 111a, and the edge region of the lower plate 111b is thinner than the central region of the lower plate 111b.

Referring to FIG. 6B, the lower surface of the upper plate 111a has a central region and an edge region which are flat, and the lower surface of the upper plate 111a is stepped such that the central region thereof is positioned at a higher level than the edge region thereof. The upper surface of the lower plate 111b has a shape corresponding to the lower surface of the upper plate 111a and is stepped such that the central region thereof is positioned at a higher level than the edge region thereof. The edge region of the upper plate 111a is thicker than the central region of the upper plate 111a, and the edge region of the lower plate 111b is thinner than the central region of the lower plate 111b.

Referring to FIG. 6C, an insert groove 118 is formed at the lower surface of the upper plate 111a, and the lower plate 111b is inserted into the insert groove 118. The insert groove 118 and the lower plate 111b are provided in plurality, and one lower plate 111b is inserted into one insert groove 118. The insert groove 118 has a shape corresponding to an outer shape of the lower plate 111b. For example, in the case where the lower plate 111b has a rectangular section, the insert groove 118 also has a rectangular section. The insert grooves 118 may have different depths. Concretely, the depth of the insert groove 118 is shallow as it goes far from the center of the upper plate 111a. Therefore, the central region of the upper plate 111a is thicker than the edge region thereof. The respective lower plates 111b may be separated independently from the insert grooves 118. in the case where the resistance heat generating member 121 coupled to any one of the lower plates 111b does not generate heat sufficiently, only the lower plate 111b to which the resistance heat generating member 121 is coupled may be separated from the upper plate 111a, and then repaired or replaced, thereby easily repairing the substrate heating unit 110.

Figure 7B:
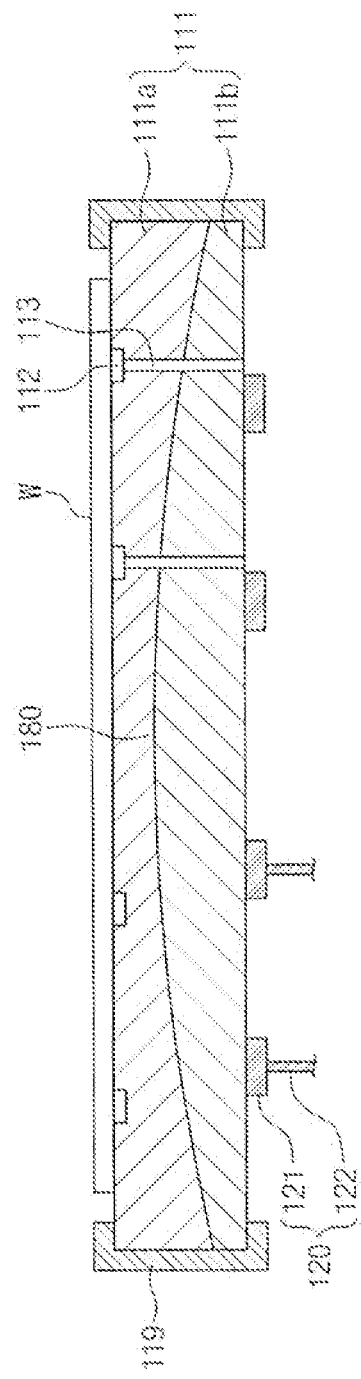

While the foregoing embodiment describes that the upper plate 111a and the lower plate 111b are adsorbed and coupled by vacuum, the inventive concept is not limited thereto. FIGS. 7A and 7B are schematic sectional views illustrating coupling structures of upper plate 111a and lower plate 111b according to another embodiment.

Referring to FIG. 7A, the upper plate 111a is physically coupled to the lower plate 111b by a bolt 119. A supporting plate 111 has a plurality of coupling holes into which the bolt 119 is inserted from the lower surface of the lower plate 111b to an inside of the upper plate 111a. The bolt 119 is inserted into the coupling holes to couple the upper plate 111a and the lower plate 111b such that the lower surface of the upper plate 111a contacts the upper surface of the lower plate 111b.

Referring to FIG. 7B, the upper plate 111a is physically coupled to the lower plate 111b by a '⊏'-shaped coupler 119. The coupler 119 includes a plurality of couplers which are provided along a circumferential surface of the supporting plate and are spaced apart from one another. Circumferential parts of the upper plate 111a and the lower plate 111b are inserted into the '⊏'-shaped coupler 119.

Also, the upper plate 111a and the lower plate 111b may be coupled by an adhesive. By providing the adhesive between the lower surface of the upper plate 111a and the upper surface of the lower plate 111b, the upper plate 111a can be easily coupled to the lower plate 111b.

However, in the case where the upper plate 111a and the lower plate 111b are coupled by the foregoing method, the following problems may be caused. When the supporting plate 111 is heated to a high temperature, a greater thermal transformation occurs in the lower plate 111b than in the upper plate 111a. This thermal transformation may generate a stress in the bolt (see 119 of FIG. 7A) coupling the upper plate 111a and the lower plate 111b to damage the bolt 119. The thermal transformation causes the coupler (see 119 of FIG. 7B) to be released from the supporting plate 111, so that the upper plate 111a and the lower plate 111b may not be coupled rigidly. Also, since the adhesive force of the adhesive attaching the upper plate 111a and the lower plate 111b decreases in a high temperature state, when the supporting plate 111 is heated to a high temperature, the adhesive may not couple the upper plate 111a and the lower plate 111b sufficiently.

Unlike the above case, in the case where the upper plate 111a and the lower plate 111b are vacuum-adsorbed, although the supporting plate is heated to a high temperature or thermal transformation is generated due to heating, vacuum-adsorbing state is still maintained and thus the upper plate 111a and the lower plate 111b can be coupled regardless of temperature.

Figure 8A:
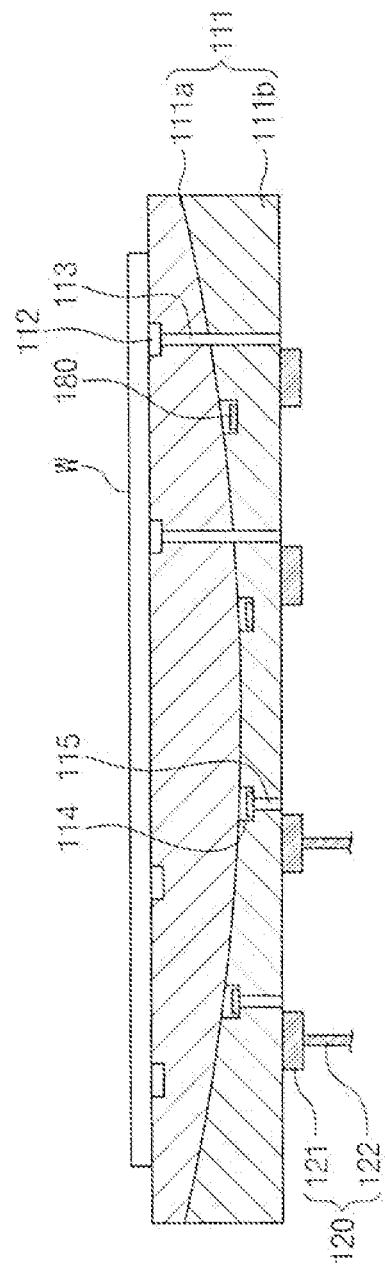

While the forgoing embodiment describes that the edge region of the upper plate 111a is thicker than the central region thereof, the inventive concept is not limited thereto. As shown in FIGS. 8A and 8B, in another embodiment, the central region of the upper plate 111a may be thicker than the edge region thereof. According to an embodiment, the lower surface of the upper plate 111a has a downward convex curved shape (see FIG. 8A), and the upper surface of the lower plate 111b has a concave curved shape corresponding to the lower surface of the upper plate 111a. According to another embodiment, the lower surface of the upper plate 111a has a central region and an edge region which are flat, and is stepped such that the central region thereof is positioned at a lower level than the edge region thereof (see FIG. 8B).

While the foregoing embodiment describes that cooling gas is injected toward the lower portion of the supporting plate to cool the substrate W, in another embodiment, the substrate W may be cooled by supplying cooling fluid to a cooling path formed inside the supporting plate 111. Alternatively, the substrate W and the supporting plate 111 may be cooled more effectively by supplying cooling fluid to a cooling path formed in the upper plate 111a or the lower plate 111b.

A method of heating the substrate W using the substrate heating unit 100 having the foregoing constitution according to the inventive concept will now be described.

Referring to FIGS. 2 and 5, first, as the substrate W is transferred onto the supporting plate 111 by the transfer robot, the lift pin 117 ascends along the hole 116 formed in the supporting plate 111 to hold the substrate W. Then, the lift pin 117 holding the substrate W descends and thus the substrate W is loaded on the upper surface of the upper plate 111a. The loaded substrate W is adsorbed on the upper surface of the upper plate 111a as the pressure inside the first vacuum holes 113 formed in the supporting plate 111 is decreased individually or sequentially as a group.

When current flows from the power to the resistance heat generating member 121 through the conductive wire 122, the resistance heat generating member 121 resists the flowing current to generate heat. The generated heat is transferred to the lower plate 111b. Since the central region of the lower plate 111b is thicker than the edge region thereof, a time t1 taken when heat arrives at the upper surface of the central region of the lower plate 111b is greater than the time t2 taken when heat arrives at the upper surface of the edge region of the lower plate 111b (i.e., t1>t2). The heat arriving at the upper surface of the lower plate 111b is transferred to the upper plate 111a. Since the upper plate 111a is made of a material having a thermal conductivity higher than the material of the lower plate 111b, thermal diffusion is refracted in the upper plate 111a, so that heat is transferred to a region which is wider than the heat transfer region of the lower plate 111b. Since the edge region of the upper plate 111a is thicker than the central region of the upper plate 111a, a time t4 taken when heat is transferred to the substrate W in the edge region is greater than the time t3 taken when heat is transferred to the substrate W in the central region (i.e., t4>t3). However, since the upper plate 111a is made of a material having a thermal conductivity higher than the material of the lower plate 111b, a total time take when heat is transferred to the substrate through the supporting plate 111 is less in the edge region than in the central region (i.e., t1+t3>t2+t4). Therefore, since more heat loss is generated in the edge region than in the central region but heat in the edge region is supplied within a time less than in the central region, the amount of heat supplied to the substrate W during a constant time is maintained equally. Thus, the entire surface of the substrate W is heated to a uniform temperature. After the process treating is completed, the substrate W is cooled to a predetermined temperature for a next process. The cooling of the substrate W is performed by injecting cooling gas toward the inner space 134 of the case 131 through the gas injection nozzle 171 to forcibly cool the supporting plate 111. The supporting plate 111 is cooled by the cooling gas and thus cooling heat is transferred to the substrate W, so that the substrate W is cooled rapidly.

As the substrate W is cooled to a predetermined temperature, the first vacuum holes 113 maintain a normal pressure state, and the vacuum adsorption of the substrate W is removed. Thereafter, the lift pin 117 ascends along the hole and thus the substrate W is unloaded from the supporting plate 111. The substrate W is transferred from the supporting plate 111 to the transfer robot and is then provided for a next process.

According to the present disclosure, since the entire surface of the substrate is heated uniformly, the substrate treating can be performed uniformly.

Also, since the thermal conductivity of the supporting plate is superior, it is possible to effectively heat the substrate.

Further, since the material of the upper plate is different from the material of the lower plate, the substrate damage due to the thermal transformation of the supporting plate can be prevented.

Furthermore, since the thermal transformation of the supporting plate is small, the weight and volume of the supporting plate can be decreased.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A substrate heating unit comprising:
an upper plate on which a substrate is placed, the upper plate having different thicknesses in a radial direction;
a lower plate positioned below the upper plate; and
a heat generating member installed in the lower plate to generate heat,
wherein a lower surface of the upper plate has a curved shape, and an upper surface of the lower plate has a shape corresponding to the lower surface of the upper plate.

2. The substrate heating unit of claim 1, wherein an edge region of the upper plate is thicker than a central region of the upper plate.

3. The substrate heating unit of claim 1, wherein the lower surface of the upper plate has a concave shape.

4. The substrate heating unit of claim 1, wherein a lower surface of the upper plate is stepped such that a central region of the lower surface of the upper plate is positioned at a higher level than an edge region of the lower surface of the upper plate.

5. The substrate heating unit of claim 1, wherein a lower surface of the upper plate is stepped such that a central region of the lower surface of the upper plate is positioned at a lower level than an edge region of the lower surface of the upper plate.

6. The substrate heating unit of claim 1, wherein a material of the upper plate or a material of the lower plate has a thermal conductivity higher than the other.

7. The substrate heating unit of claim 6, wherein a material of the upper plate has a thermal conductivity higher than the material of the lower plate.

8. The substrate heating unit of claim 6, wherein a material of the upper plate is a nitride ceramic or carbide ceramic, and the material of the lower plate is an insulator ceramic.

9. The substrate heating unit of claim 6, wherein the upper surface of the upper plate is formed with a plurality of first vacuum holes in a radial direction thereof, the pressure of the first vacuum holes is controlled individually or as a group such that the pressure inside the first vacuum holes is changed according to the region of the substrate,
wherein the substrate heating unit comprises:
a first vacuum pump; and
a first vacuum line connecting the first vacuum pump to the first vacuum holes.

10. The substrate heating unit of claim 9, wherein the lower surface of the upper plate or the upper surface of the lower plate is formed with a groove, and the lower plate is formed with a second vacuum hole connected to the groove,
wherein the substrate heating unit comprises:
a second vacuum pump; and
a second vacuum line connecting the second vacuum pump to the second vacuum hole.

11. The substrate heating unit of claim 10, wherein the groove has a ring shape and is provided in plurality, and the ring-shaped grooves have a coaxial axis and different diameters.

12. The substrate heating unit of claim 1, wherein the heat generating member comprises a resistance heat generating member coupled to a lower surface of the lower plate to generate heat by an applied electric power.

13. The substrate heating unit of claim 6, wherein the lower surface of the upper plate is formed with an insert groove, and the lower plate is inserted into the insert groove.

14. The substrate heating unit of claim 13, wherein the lower plate is provided in plurality, and the plurality of lower plates are separatable independently from the insert groove.

15. The substrate heating unit of claim 14, wherein the plurality of lower plates are divided into plural groups each having at least one the lower plate, and the plural groups comprise a group including the lower plates which are combined and are disposed in a single ring shape.

16. The substrate heating unit of claim 10, further comprising a temperature measuring member positioned at the groove to measure the temperature of the upper plate.

17. A substrate treating apparatus comprising:
a process chamber having an inner space;
an upper plate positioned in the inner space, supporting a substrate, and having a thickness different in a radial direction thereof;
a lower plate positioned below the upper plate and having an upper surface corresponding to a lower surface of the upper plate; and
a heat generating member installed in the lower plate to generate heat,
wherein a material of the upper plate has a thermal conductivity higher than the material of the lower plate, and
wherein the lower surface of the upper plate has a concave shape.

18. The substrate treating apparatus of claim 17, wherein the upper plate has a thickness increasing as it goes far from a center thereof.

19. The substrate treating apparatus of claim 18, wherein the upper plate has a central region which is thicker than an edge region thereof.

20. The substrate treating apparatus of claim 17, wherein the upper surface of the upper plate is formed with a plurality of first vacuum holes in a radial direction thereof, the pressure of the first vacuum holes is controlled individually or as a group such that the pressure inside the first vacuum holes is changed according to the region of the substrate,
wherein the substrate heating unit comprises:
a first vacuum pump; and
a first vacuum line connecting the first vacuum pump to the first vacuum holes.

21. The substrate treating apparatus of claim 20, wherein the lower surface of the upper plate or the upper surface of the lower plate is formed with a groove, and the lower plate is formed with a second vacuum hole connected to the groove,
wherein the substrate treating apparatus comprises:
a second vacuum pump; and
a second vacuum line connecting the second vacuum pump to the second vacuum hole.

22. The substrate treating apparatus of claim 17, wherein the heat generating member comprises a resistance heat generating member coupled to a lower surface of the lower plate to generate heat by an applied electric power.

* * * * *